(12) United States Patent
Xi (10) Patent No.: US 11,935,737 B2
(45) Date of Patent: Mar. 19, 2024

(54) CLEANING MACHINE AND CLEANING METHOD

(71) Applicant: CHANGXIN MEMORY TECHNOLOGIES, INC., Hefei (CN)

(72) Inventor: Ning Xi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 248 days.

(21) Appl. No.: 17/441,660

(22) PCT Filed: Jun. 21, 2021

(86) PCT No.: PCT/CN2021/101343
§ 371 (c)(1),
(2) Date: Sep. 21, 2021

(87) PCT Pub. No.: WO2022/057351
PCT Pub. Date: Mar. 24, 2022

(65) Prior Publication Data
US 2023/0054051 A1 Feb. 23, 2023

(30) Foreign Application Priority Data
Sep. 17, 2020 (CN) .......................... 202010982723.1

(51) Int. Cl.
*H01L 21/02* (2006.01)
*H01L 21/67* (2006.01)
*H01L 21/677* (2006.01)

(52) U.S. Cl.
CPC .. *H01L 21/02068* (2013.01); *H01L 21/67034* (2013.01); *H01L 21/6704* (2013.01); *H01L 21/6776* (2013.01)

(58) Field of Classification Search
CPC ......... H01L 21/02068; H01L 21/67034; H01L 21/6704; H01L 21/6776
(Continued)

(56) References Cited

U.S. PATENT DOCUMENTS 6,447,385 B1 9/2002 Togawa et al.
9,153,464 B2 10/2015 Kang et al.
(Continued)

FOREIGN PATENT DOCUMENTS

CN 102810461 A 12/2012
KR 102090685 B1 3/2020

OTHER PUBLICATIONS

International Search Report cited in PCT/CN2021/101343 dated Sep. 26, 2021, 8 pages.

*Primary Examiner* — Tinsae B Ayalew
(74) *Attorney, Agent, or Firm* — Cooper Legal Group, LLC (57) ABSTRACT

Disclosed in the present disclosure are a cleaning machine and a cleaning method. The cleaning machine includes: a wet cleaning module, configured to execute a wet cleaning process on a wafer; a dry cleaning module, configured to execute a dry cleaning process on the wafer; a conveying module, configured to input the wafer into the wet cleaning module or the dry cleaning module, or output the wafer from the wet cleaning module or the dry cleaning module; a transferring module, configured to transfer the wafer from the wet cleaning module to the dry cleaning module or transfer the wafer from the dry cleaning module to the wet cleaning module; and a processing module, configured to extract gas from the transferring module.

11 Claims, 7 Drawing Sheets

(58) Field of Classification Search
USPC .......................................................... 134/61
See application file for complete search history.

(56) References Cited

U.S. PATENT DOCUMENTS

2007/0111519 A1* 5/2007 Lubomirsky ..... H01L 21/02068
257/E21.174
2016/0307783 A1* 10/2016 Iida ................... H01L 21/02263

* cited by examiner

CLEANING MACHINE AND CLEANING METHOD

CROSS-REFERENCE TO RELATED APPLICATIONS

The present application is a national stage entry of International Application No. PCT/CN2021/101343, filed on Jun. 21, 2021, which claims priority to Chinese Patent Application 202010982723.1, titled "CLEANING MACHINE AND CLEANING METHOD", filed on Sep. 17, 2020. The entire contents of International Application No. PCT/CN2021/101343 and Chinese Patent Application 202010982723.1 are incorporated herein by reference in their entireties.

TECHNICAL FIELD

The present disclosure relates to, but is not limited to, a cleaning machine and a cleaning method.

BACKGROUND

At present, in the process of forming the semiconductor contact structure, over etching is often caused due to the inability to accurately control the etching time, thus forming etching defects. The conductivity of the semiconductor contact structure formed is greatly affected by etching defects.

In the related art, different cleaning processes, such as the dry cleaning process and the wet cleaning process, are needed to be configured cooperatively to fill etching defects formed. However, when different cleaning processes are configured to clean the semiconductor structure, the waiting time for switching the cleaning processes is long, which cannot ensure the stability of the semiconductor structure formed by filling etching defects.

SUMMARY

The subject matter is described in detail herein below, which is not intended to limit the scope of protection of claims.

The present disclosure provides a cleaning machine. The cleaning machine includes: a wet cleaning module, configured to execute a wet cleaning process on a wafer; a dry cleaning module, configured to execute a dry cleaning process on the wafer; a conveying module, configured to input the wafer into the wet cleaning module or the dry cleaning module, or output the wafer from the wet cleaning module or the dry cleaning module; a transferring module, configured to transfer the wafer from the wet cleaning module to the dry cleaning module, or transfer the wafer from the dry cleaning module to the wet cleaning module; and a processing module, configured to extract gas from the transferring module.

The present disclosure further provides a cleaning method.

The cleaning method according to the embodiment of the present disclosure is applied to the cleaning machine, and includes: acquiring the wafer to be cleaned and a cleaning process of the wafer; determining, on the basis of the cleaning process of the wafer, whether the wafer to be cleaned needs to be subjected to the dry cleaning process and the wet cleaning process and a cleaning sequence of the dry cleaning process and the wet cleaning process; and controlling, on the basis of the cleaning sequence, a position of the wafer on the cleaning machine, so as to complete cleaning of the wafer, where the wafer is moved into the dry cleaning module of the cleaning machine under the condition that the wafer to be cleaned needs to be subjected to the dry cleaning process, so as to complete the dry cleaning process of the wafer; and the wafer is moved into the wet cleaning module of the cleaning machine under the condition that the wafer to be cleaned needs to be subjected to the wet cleaning process, so as to complete the wet cleaning process of the wafer.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are used for representing similar elements. The drawings in the following description are only some rather than all of the embodiments of the present disclosure. Those skilled in the art would be able to derive other drawings from these drawings without making creative efforts.

DETAILED DESCRIPTION

A cleaning machine and a cleaning method provided in the present disclosure will be described below with reference to the drawings and particular embodiments.

At present, different cleaning processes, such as a dry cleaning process and a wet cleaning process, are needed to be configured cooperatively to fill etching defects formed. However, when different cleaning processes are configured to clean a semiconductor structure, waiting time for switching the cleaning processes is long, which may not ensure stability of the semiconductor structure formed by filling the etching defect.

Embodiment 1 of the present disclosure provides a cleaning machine. The cleaning machine includes: a wet cleaning module, configured to execute the wet cleaning process on a wafer; a dry cleaning module, configured to execute the dry cleaning process on the wafer; a conveying module, configured to input the wafer into the wet cleaning module or the dry cleaning module, or output the wafer from the wet cleaning module or the dry cleaning module; a transferring module, configured to transfer the wafer from the wet cleaning module to the dry cleaning module, or transfer the wafer from the dry cleaning module to the wet cleaning module; and a processing module, configured to extract gas from the transferring module. The present disclosure designs one special machine so as to reduce waiting time between different cleaning processes in cooperative use of the dry cleaning process and the wet cleaning process, thereby improving stability of a semiconductor structure formed by filling an etching defect.

Each embodiment of the present disclosure will be described in detail below with reference to the drawings. However, those skilled in the art may understand that in each embodiment of the present disclosure, many technical details have been put forward in order to make readers better understand the present disclosure. However, even without these technical details and various changes and modifications based on each embodiment below, technical solutions to be protected as required in the present disclosure may be achieved. The following embodiments are divided for convenience of the description and should not constitute any limitation on the specific embodiment of the present disclosure. The embodiments may be combined with and referenced to each other on the premise of no contradiction.

Figure 1:
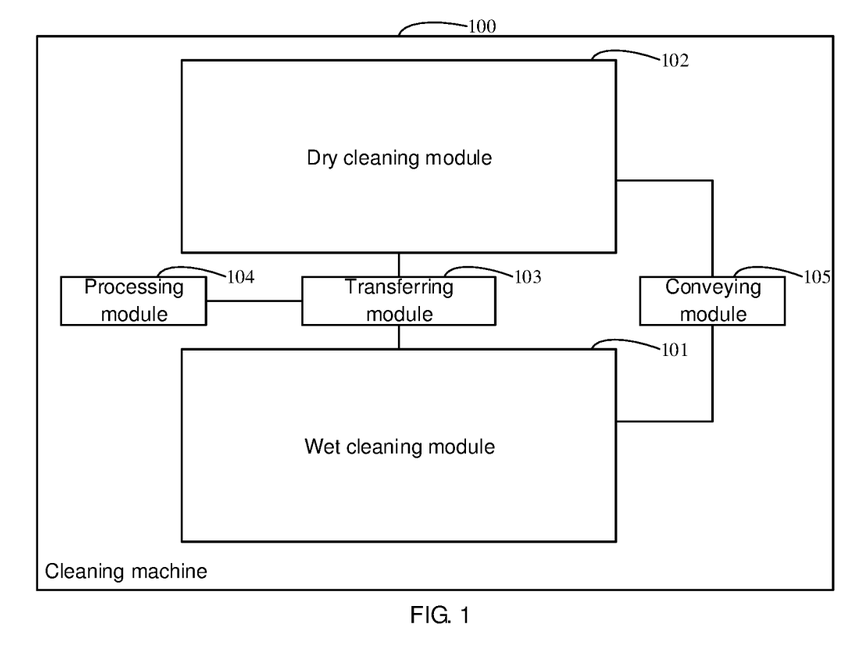
FIG. 1 is a structural schematic diagram of a cleaning machine provided in Embodiment 1 of the present disclosure.

FIG. 1 is a structural schematic diagram of the cleaning machine provided in the embodiment of the present disclosure. The cleaning machine of the embodiment of the present disclosure will be specifically illustrated below.

With reference to FIG. 1, the cleaning machine 100 includes:

the wet cleaning module 101, configured to execute the wet cleaning process on the wafer accommodated therein, the wet cleaning module 101 being configured to use a liquid chemical to perform the wet cleaning process on the wafer in an atmospheric environment;

the dry cleaning module 102, configured to execute the dry cleaning process on the wafer accommodated therein, the dry cleaning module 102 being configured to use gas with a plasma state to perform the dry cleaning process on the wafer in a vacuum environment;

the transferring module 103, configured to transfer the wafer from the wet cleaning module 101 to the dry cleaning module 102, or transfer the wafer from the dry cleaning module 102 to the wet cleaning module 101, the wafer being automatically carried from the wet cleaning module 101 to the dry cleaning module 102, or the wafer being automatically carried from the dry cleaning module 102 to the wet cleaning module 101 by means of the transferring module 103;

the processing module 104, configured to extract the gas from the transferring module 103, the wet cleaning module 101 and the dry cleaning module 102 in the cleaning machine 100 being two chambers independent of each other since the wet cleaning module 101 is in the atmospheric environment and the dry cleaning module 102 is in the vacuum environment, and in a process of carrying the wafer by the transferring module 103, the gas being extracted from the transferring module 103 by means of the processing module 104, thereby preventing environmental interference between the wet cleaning module 101 and the dry cleaning module 102, where in the exemplary embodiment, the processing module 104 includes a gas extracting pump connected to the transferring module 103, and the gas being extracted from the transferring module 103 by means of the gas extracting pump connected to the transferring module 103, so as to make the transferring module in a vacuum-like environment, thereby preventing an environmental influence of the wet cleaning module 101 on the dry cleaning module 102; and the conveying module 105, configured to input the wafer into the wet cleaning module 101 or the dry cleaning module 102, or output the wafer from the wet cleaning module 101 or the dry cleaning module 102, the conveying module 105 being configured to input an external wafer into the cleaning machine 100 to execute the dry cleaning process or the wet cleaning process, and output the processed wafer from the cleaning machine 100.

Figure 2:
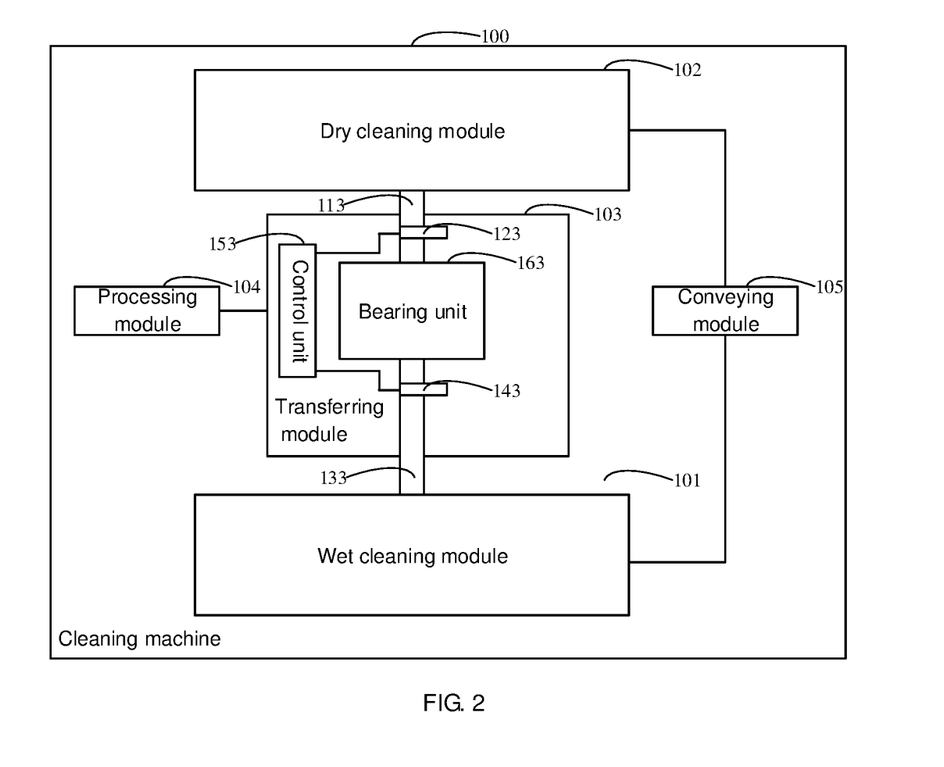
FIG. 2 is a structural schematic diagram of the cleaning machine provided in Embodiment 1 of the present disclosure.

With reference to FIG. 2, in this embodiment, the cleaning machine 100 further includes a first channel 113 by means of which the transferring module 103 is connected to the dry cleaning module 102, and a second channel 133 by means of which the transferring module 103 is connected to the wet cleaning module 101, where the first channel 113 is configured to transfer the wafer between the transferring module 103 and the dry cleaning module 102, and the second channel 133 is configured to transfer wafer between the transferring module 103 and the wet cleaning module 101.

The transferring module 103 includes a bearing unit 163, a first blocking unit 123, a second blocking unit 143, and a control unit 153, where the bearing unit 163 is configured to bear the wafer transferred from the wet cleaning module 101 to the dry cleaning module 102 or configured to bear the wafer transferred from the dry cleaning module 102 to the wet cleaning module 101; the first blocking unit 123 is configured to open or close the first channel 113 and open the first channel 113 when the wafer needs to be transferred between the bearing unit 163 and the dry cleaning module 102; the second blocking unit 143 is configured to open or close the second channel 133, and open the second channel 133 when the wafer needs to be transferred between the bearing unit 163 and the wet cleaning module 101; and the control unit 153 is configured to open or close the first blocking unit 123 and the second blocking unit 143.

In the exemplary embodiment, when it is detected that the wafer needs to be transferred from the wet cleaning module 101 to the dry cleaning module 102, the control unit 153 opens the second blocking unit 143, the wafer is transferred from the wet cleaning module 101 to the bearing unit 163 of the transferring module 103 by means of the second channel 133, and the control unit 153 closes the second blocking unit 143; gas is extracted from the transferring module 103 to ensure that the transferring module 103 is in a vacuum-like environment when the wafer transferred between the transferring module and the dry cleaning module 102; and the control unit 153 opens the first blocking unit 123, the wafer is transferred from the transferring module 103 to the dry cleaning module 102 by means of the first channel 113, and the control unit 153 closes the first blocking unit 123.

In the exemplary embodiment, when it is detected that the wafer needs to be transferred from the dry cleaning module 102 to the wet cleaning module 101, and gas is extracted from the transferring module 103 to ensure that the transferring module 103 is in a vacuum-like environment when the wafer is transferred between the transferring module and the dry cleaning module 102; the control unit 153 opens the first blocking unit 123, the wafer is transferred from the dry cleaning module 102 to the bearing unit 163 of the transferring module 103 by means of the first channel 113, and the control unit 153 closes the first blocking unit 123; and the control unit 153 opens the second blocking unit 143, the wafer is transferred from the transferring module 103 to the wet cleaning module 101 by means of the second channel 133, and the control unit 153 closes the second blocking unit 143.

Figure 4:
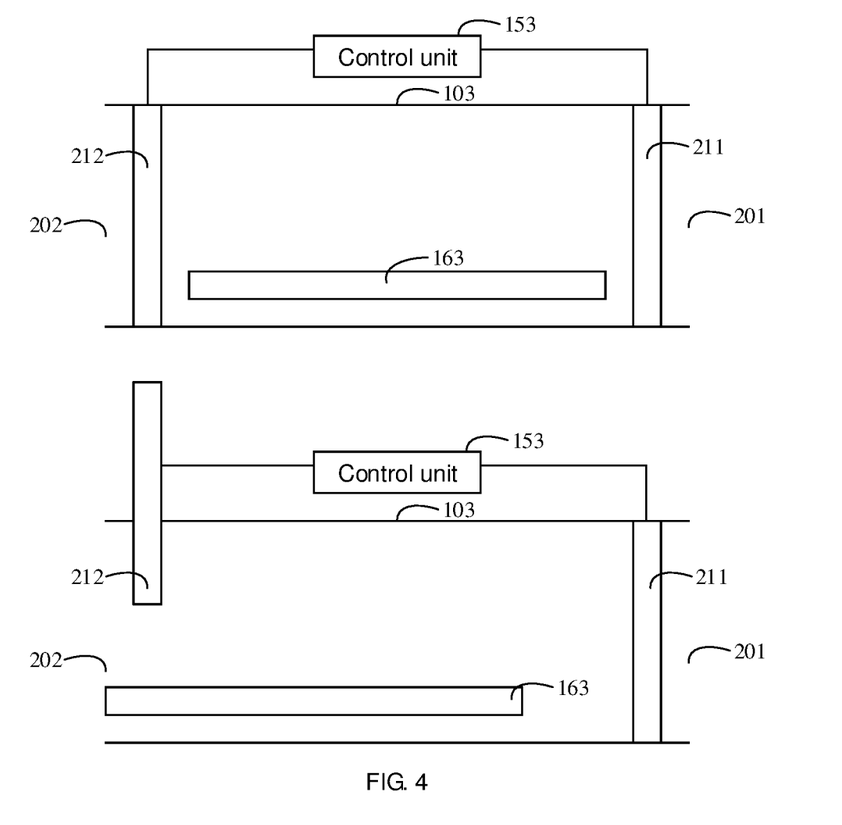
FIG. 4 is a structural schematic diagram of an embodiment manner of a transferring module provided in Embodiment 1 of the present disclosure.

In the exemplary embodiment, this embodiment provides two embodiment methods for the transferring module, which are specifically as follows:

with reference to FIG. 4, in a first embodiment method: the transferring module 103 includes a container having a first opening 201 and a second opening 202, where the first opening 201 is used for transferring of the wafer between the bearing unit 163 and the dry cleaning module 102, and the second opening 202 is used for transferring of the wafer between the bearing unit 163 and the wet cleaning module 101.

The first blocking unit 123 includes a first baffle plate 211 arranged at the first opening 201, and the second blocking unit 143 includes a second baffle plate 212 arranged at the second opening 202.

The control unit 153 is connected to the first baffle plate 211 and the second baffle plate 212 and configured to control the first baffle plate 211 or the second baffle plate 212, so as to open the first opening 201 or the second opening 202.

In this embodiment method, the control unit 153 directly controls the first baffle plate 211 and the second baffle plate 212, so as to open or close the first opening 201 for transferring the wafer between the transferring module 103 and the dry cleaning module 102, or the second opening 202 for transferring the wafer between the transferring module 103 and the wet cleaning module 101.

Figure 5:
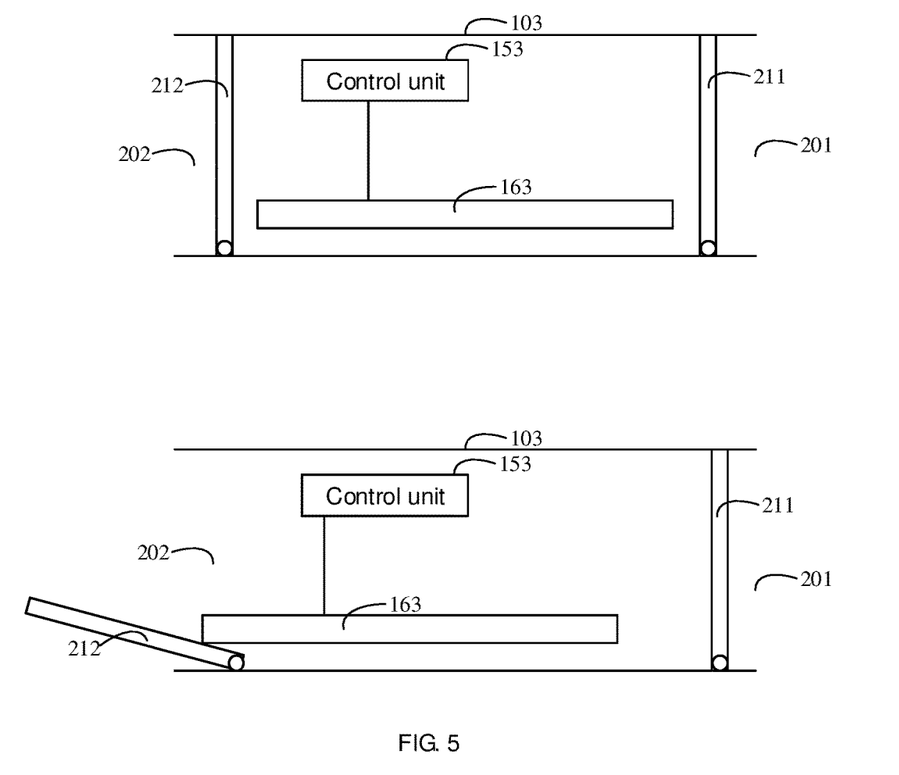
FIG. 5 is a structural schematic diagram of an embodiment manner of another transferring module provided in Embodiment 1 of the present disclosure.

With reference to FIG. 5, in a second embodiment method: the transferring module 103 includes a container having a first opening 201 and a second opening 202, where the first opening 201 is used for transferring of the wafer between the bearing unit 163 and the dry cleaning module 102, and the second opening 202 is used for transferring of the wafer between the bearing unit 163 and the wet cleaning module 101.

The first blocking unit includes a first baffle plate 211 elastically connected to one side of the first opening 201 by means of a hinge, and the second blocking unit includes a second baffle plate 212 elastically connected to one side of the second opening 202 by means of a hinge.

The control unit 153 is connected to the bearing unit 163, the bearing unit 163 moves towards the first opening 201, so as to drive the first baffle plate 211 to be opened when the wafer is transferred between the bearing unit 163 and the dry cleaning module 102, and the bearing unit 163 moves towards the second opening 202, so as to drive the second baffle plate 212 to be opened when the wafer is transferred between the bearing unit 163 and the wet cleaning module 101.

In this embodiment method, the control unit 153 directly controls movement of the bearing unit 163, thereby indirectly controlling the first baffle plate 211 and the second baffle plate 212 so as to open or close the first opening 201 for transferring the wafer between the transferring module 103 and the dry cleaning module 102, or the second opening 202 for transferring the wafer between the transferring module 103 and the wet cleaning module 101.

Figure 6:
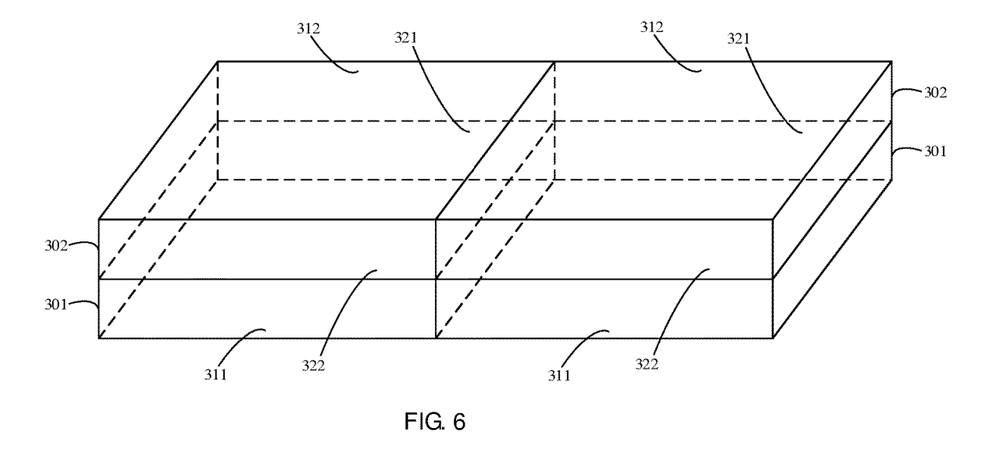
FIG. 6 is a structural schematic diagram of a conveying module of Embodiment 1 of the present disclosure.

With reference to FIG. 6, in this embodiment, the transferring module 103 is divided into a first transferring unit 301 and a second transferring unit 302, where the first transferring unit 301 is configured to transfer the wafer from the wet cleaning module 101 to the dry cleaning module 102, and the second transferring unit 302 is configured to transfer the wafer from the dry cleaning module 102 to the wet cleaning module 101. The first transferring unit 301 and the second transferring unit 302 separated from each other transfer the wafer from the dry cleaning module 102 to the wet cleaning module 101 and from the wet cleaning module 101 to the dry cleaning module 102 respectively, thereby avoiding a conflict of a transfer process of the wafer.

A first side surface 311 of the first transferring unit 301 is connected to the wet cleaning module 101, and a second side surface 321 of the first transferring unit is connected to the dry cleaning module 102; and a first side surface 322 of the second transferring unit 302 is connected to the wet cleaning module 101, and a second side surface 312 of the second transferring unit is connected to the dry cleaning module 102.

In the exemplary embodiment, the first transferring unit 301 includes a plurality of first transferring sub-units, and the second transferring unit 302 includes a plurality of second transferring sub-units, where the plurality of first transferring sub-units are all configured to transfer the wafer from the wet cleaning module 101 to the dry cleaning module 102, and the plurality of second transferring sub-units are all configured to transfer the wafer from the dry cleaning module 102 to the wet cleaning module 101. The plurality of first transferring sub-units and second transferring sub-units parallel to each other improve efficiency transferring the wafer between the wet cleaning module 101 and the dry cleaning module 102 in the cleaning machine 100.

In this embodiment, the first transferring unit 301 and the second transferring unit 302 are arranged one above the other, and the first transferring unit 301 and the second transferring unit 302 arranged one above the other are disposed for saving a space of the cleaning machine 100. In other embodiments, a first transferring unit and a second transferring unit may be arranged parallel to or separated from each other.

Figure 3:
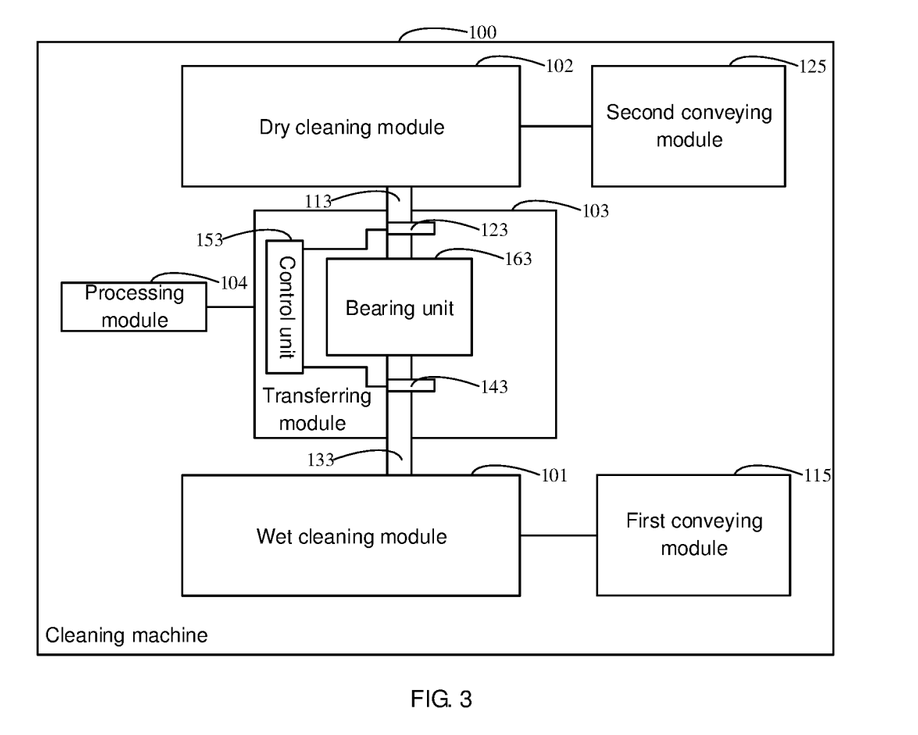
FIG. 3 is a structural schematic diagram of the cleaning machine provided in Embodiment 1 of the present disclosure.

With reference to FIG. 3, in this embodiment, the conveying module 105 includes a first conveying unit 115 and a second conveying unit 125, where the first conveying unit 115 is connected to one of the wet cleaning module 101 and the dry cleaning module 102 and is configured to input the wafer into the wet cleaning module 101 connected to the first conveying unit 115 or the dry cleaning module 102 connected to the first conveying unit 115; and the second conveying unit 125 is connected to one of the wet cleaning module 101 and the dry cleaning module 102 and is configured to output the wafer from the wet cleaning module 101 connected to the second conveying unit 125 or the dry cleaning module 102 connected to the second conveying unit 125.

In this embodiment, the first conveying unit 115 being connected to the dry cleaning module 102 and the second conveying unit 125 being connected to the wet cleaning module 101 are taken as examples for detailed introduction. It should be noted that in other embodiments, a manner that the first conveying unit is connected to the wet cleaning module and the second conveying unit is connected to the dry cleaning module may be used for connection.

Input and output are achieved by means of the first conveying unit 115 and the second conveying unit 125 connected to the dry cleaning module 102 and the wet cleaning module 101. If the wafer needs to be sequentially subjected to the wet cleaning process and the dry cleaning process, the wafer enters the dry cleaning module 102 from the first conveying unit 115, so as to be subjected to the dry cleaning process, and then the wafer is transferred to the wet cleaning module 101, so as to be subjected to the wet cleaning process, and then may be directly output from the second conveying unit 125, thereby avoiding a situation that during embodiment with one conveying unit, the wafer further needs to be output from the dry cleaning module 102 or wet cleaning module 101 connected to the conveying unit, improving efficiency of a wafer process, and thereby increasing production capacity.

In the exemplary embodiment, the first conveying unit 115 includes a plurality of first conveying sub-units, and the second conveying unit 125 includes a plurality of second conveying sub-units, where the plurality of first conveying sub-units are all configured to input the wafer into the wet cleaning module 101 connected to the first conveying unit 115 or the dry cleaning module 102 connected to the first conveying unit 115; and the plurality of second conveying sub-units are all configured to output the wafer from the wet cleaning module 101 connected to the second conveying unit 125 or the dry cleaning module 102 connected to the second conveying unit 125. The plurality of first conveying sub-units and second conveying sub-units parallel to each other improve efficiency of inputting the wafer into the cleaning machine 100 and outputting the wafer from the cleaning machine 100.

In this embodiment, the transferring module 103 further includes a third transferring unit, where the third transferring unit is configured to be connected to the conveying unit 125 and one of the wet cleaning module 101 or the dry cleaning module 102, is configured to transfer the wafer in the wet cleaning module 101 or the dry cleaning module 102 connected to the third transferring unit to the conveying module 105, so as to allow the conveying module 105 to output the wafer from the wet cleaning module 101 or the dry cleaning module 102. The conveying module 105 and the wet cleaning module 101 or the dry cleaning module 102 are indirectly connected by means of the third transferring unit, thereby avoiding environmental interference of an external environment to the wet cleaning module 101 or the dry cleaning module 102.

Figure 7:
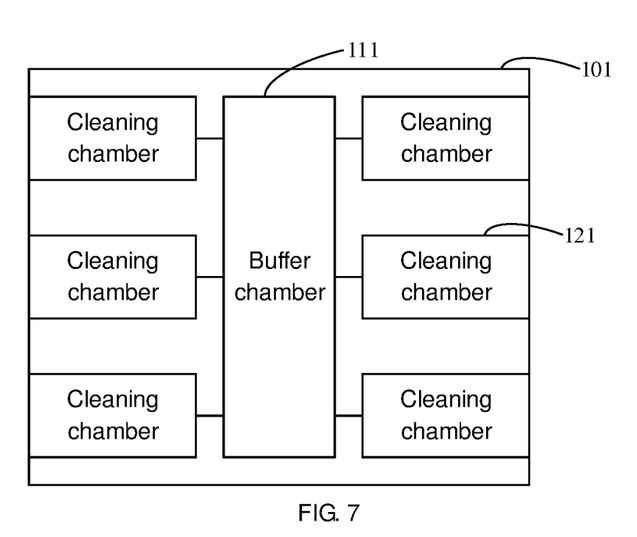
FIG. 7 is a structural schematic diagram of a wet cleaning module provided in Embodiment 1 of the present disclosure.

With reference to FIG. 7, in this embodiment, the wet cleaning module 101 includes a buffer chamber 111 and a plurality of cleaning chambers 121, where
the buffer chamber 111 is configured to accommodate the wafer to be cleaned, and the plurality of cleaning chambers 121 connected to the buffer chamber 111 are configured to perform the wet cleaning process on the wafer accommodated in the cleaning chambers 121. The plurality of cleaning chambers 121 performs the wet cleaning process in parallel, thereby improving efficiency of performing wet cleaning on the wafer.

Figure 8:
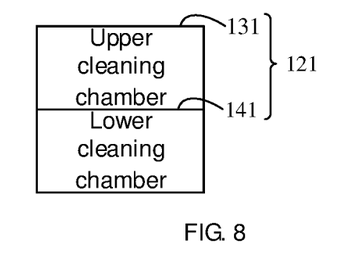
FIG. 8 is a structural schematic diagram of arrangement of reaction chambers of Embodiment 1 of the present disclosure.

With reference to FIG. 8, in this embodiment, the cleaning chambers 121 located at the same top view position are arranged one above the other, an upper cleaning chamber 131 and a lower cleaning chamber 141 arranged one above the other are used for saving the space of the cleaning machine 100, and more cleaning chambers 121 may be arranged under the same space of the cleaning machine 100, so as to improve the efficiency of performing wet cleaning on the wafer.

Figure 9:
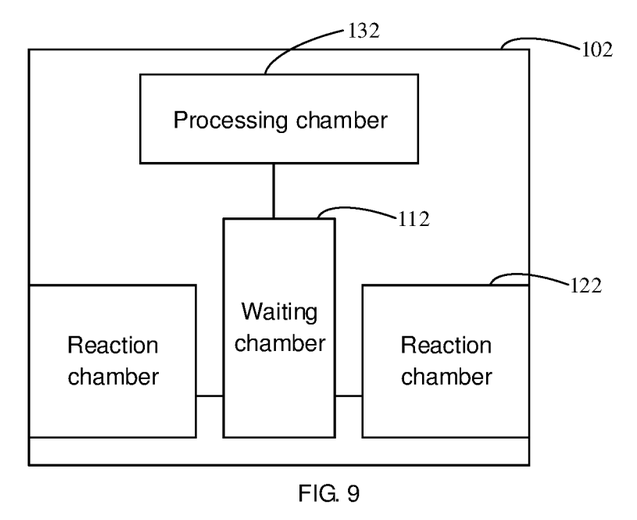
FIG. 9 is a structural schematic diagram of a dry cleaning module provided in Embodiment 1 of the present disclosure.

With reference to FIG. 9, in this embodiment, the dry cleaning module 102 includes a waiting chamber 112 and a plurality of reaction chambers 122, where
the waiting chamber 112 is configured to accommodate the wafer to be cleaned, and the plurality of reaction chambers 122 connected to the waiting chamber 112 are configured to perform the dry cleaning process on the wafer accommodated in the reaction chambers 122. The plurality of reaction chambers 122 performs the dry cleaning process in parallel, thereby improving efficiency of performing dry cleaning on the wafer.

In this embodiment, the dry cleaning module 102 further includes a processing chamber 132 configured to anneal the wafer accommodated in the processing chamber 132.

Annealing may reduce hardness of the wafer, improve machinability of the wafer, eliminate residual stress of the wafer, stabilize a size of the wafer, and reduce deformation and cracking tendency of the wafer.

Correspondingly, the conveying module 105 further includes a cooling device, where the cooling device is further configured to cool the wafer before the conveying module outputs the wafer from the cleaning machine.

In the exemplary embodiment, the cooling device is implemented by arranging a cooling pipeline in a bearing apparatus for bearing the wafer, and the wafer is cooled by introducing a cooling liquid into the cooling pipeline.

Dry cleaning and wet cleaning are integrated into one machine, and then the transferring module quickly transfers the semiconductor structure needing to be subjected to the dry cleaning process or the wet cleaning process, so as to reduce the waiting time of the semiconductor structure between different cleaning processes, thereby improving the stability of the semiconductor structure formed by filling the etching defect.

It is worth mentioning that all modules involved in this embodiment are logic modules, and in practical application, one logic unit may be a physical unit or a part of a physical unit, and may also be achieved by a combination of a plurality of physical units. Furthermore, in order to highlight the innovative part of the present disclosure, units which are less closely related to solving the technical problem of the present disclosure are not introduced in this embodiment, but this does not indicate that no other units are present in this embodiment.

Embodiment 2 of the present disclosure relates to a cleaning method.

The cleaning method includes: acquire a wafer to be cleaned and a cleaning process of the wafer; determine, on the basis of the cleaning process of the wafer, whether the wafer to be cleaned needs to be subjected to a dry cleaning process and a wet cleaning process and a cleaning sequence of the dry cleaning process and the wet cleaning process; and control, on the basis of the cleaning sequence, a position of the wafer on a cleaning machine, so as to complete cleaning of the wafer, where the wafer is moved into a dry cleaning module of the cleaning machine under the condition that the wafer to be cleaned needs to be subjected to the dry cleaning process, so as to complete the dry cleaning process of the wafer; and the wafer is moved into a wet cleaning module of the cleaning machine under the condition that the wafer to be cleaned needs to be subjected to the wet cleaning process, so as to complete the wet cleaning process of the wafer.

The cleaning method provided in this embodiment will be described in detail below with reference to the drawings, and the parts which are the same or corresponding to Embodiment 1 will not be described in detail below.

Figure 10:
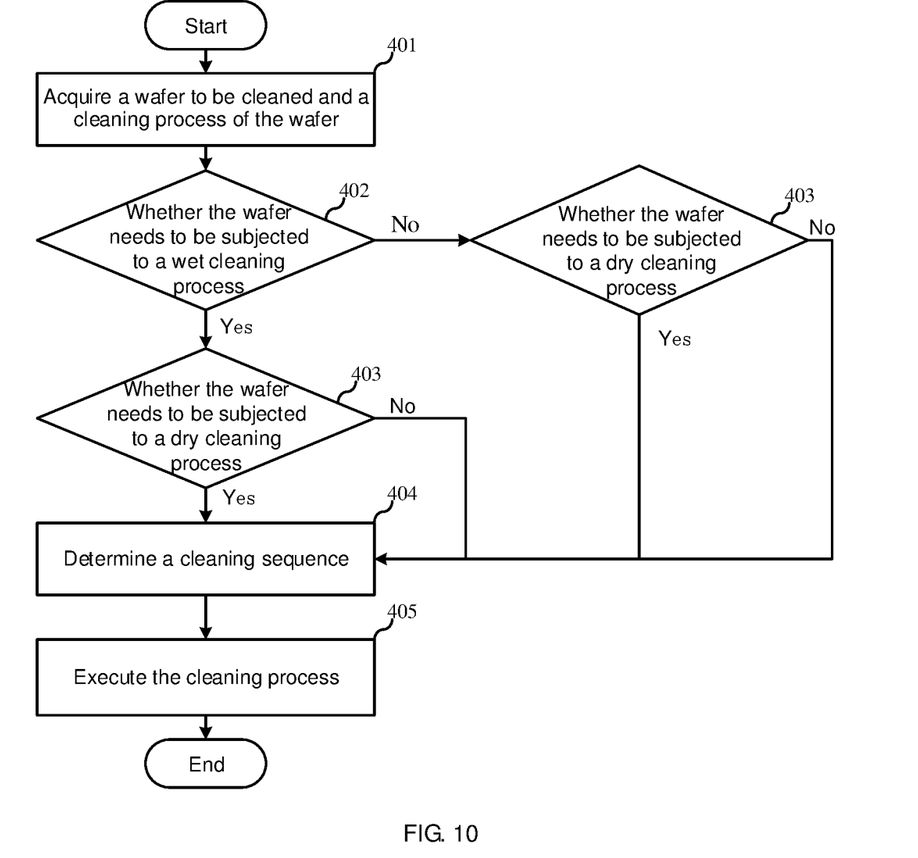
FIG. 10 is a schematic flowchart of a cleaning method provided in Embodiment 2 of the present disclosure.

With reference to FIG. 10, the cleaning method includes:

step 401, acquire the wafer to be cleaned and the cleaning process of the wafer, where the wafer to be cleaned is input into the cleaning machine, and the cleaning process of the wafer is acquired;

step 402, determine whether the wafer needs to be subjected to the wet cleaning process;

step 403, determine whether the wafer needs to be subjected to the dry cleaning process, where whether the wafer to be cleaned needs to be subjected to the dry cleaning process and the wet cleaning process is determined on the basis of the cleaning process of the wafer;

step 404, determine the cleaning sequence, where it may be known from step 403 that the wafer to be cleaned is subjected to the single-step dry cleaning process or the single-step wet cleaning process, or needs to be subjected to the dry cleaning process and the wet cleaning process, and if the wafer to be cleaned needs to be subjected to the dry cleaning process and the wet cleaning process, an execution sequence of the dry cleaning process and the wet cleaning process for the wafer to be cleaned needs to be determined;

step 405, execute the cleaning process, where the position of the wafer on the cleaning machine is controlled on the basis of the acquired cleaning sequence, so as to complete cleaning of the wafer; and the wafer is moved into the dry cleaning module of the cleaning machine if the wafer to be cleaned needs to be subjected to the dry cleaning process, so as to complete the dry cleaning process of the wafer; and the wafer is moved into the wet cleaning module of the cleaning machine if the wafer to be cleaned needs to be subjected to the wet cleaning process, so as to complete the wet cleaning process of the wafer.

The dry cleaning process and the wet cleaning process are integrated into one machine for execution to reduce waiting time of a semiconductor structure between different cleaning processes, thereby improving stability of the semiconductor structure formed by filling an etching defect.

Other embodiments of the present disclosure will be apparent to those skilled in the art from consideration of the specification and practice of the disclosure. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the drawings, and that various modifications and changes may be made without departing from the scope thereof. It is intended that the scope of the present disclosure only be limited by the appended claims.

INDUSTRIAL APPLICABILITY

According to the cleaning machine and the cleaning method provided in the present disclosure, the dry cleaning process and the wet cleaning process are integrally executed in the cleaning machine, so as to reduce the waiting time of the semiconductor structure between different cleaning processes, thereby improving the stability of the semiconductor structure formed by filling the etching defect.

The invention claimed is:

1. A cleaning machine, comprising:
   a wet cleaning module, configured to execute a wet cleaning process on a wafer;
   a dry cleaning module, configured to execute a dry cleaning process on the wafer;
   a conveying module, configured to input the wafer into the wet cleaning module or the dry cleaning module, or output the wafer from the wet cleaning module or the dry cleaning module;
   a transferring module, configured to transfer the wafer from the wet cleaning module to the dry cleaning module, or transfer the wafer from the dry cleaning module to the wet cleaning module;
   a processing module, configured to extract gas from the transferring module; and
   a first channel by means of which the transferring module is connected to the dry cleaning module, and a second channel by means of which the transferring module is connected to the wet cleaning module;
   wherein the transferring module comprises:
      a bearing unit, configured to bear the wafer conveyed from the wet cleaning module to the dry cleaning module or configured to bear the wafer conveyed from the dry cleaning module to the wet cleaning module;
      a first blocking unit, configured to open or close the first channel, and open the first channel when the wafer needs to be transferred between the bearing unit and the dry cleaning module;
      a second blocking unit, configured to open or close the second channel, and open the second channel when the wafer needs to be transferred between the bearing unit and the wet cleaning module; and
      a control unit, configured to open or close the first blocking unit and the second blocking unit.

2. The cleaning machine according to claim 1, wherein the transferring module comprises a container having a first opening and a second opening, the first opening being used for transferring of the wafer between the bearing unit and the dry cleaning module, and the second opening being used for transferring of the wafer between the bearing unit and the wet cleaning module;
   the first blocking unit comprises a first baffle plate arranged at the first opening;
   the second blocking unit comprises a second baffle plate arranged at the second opening; and
   the control unit is connected to the first baffle plate and the second baffle plate and is configured to control the first baffle plate or the second baffle plate, so as to open the first opening or the second opening.

3. The cleaning machine according to claim 1, wherein the transferring module comprises a container having a first opening and a second opening, the first opening being used for transferring of the wafer between the bearing unit and the dry cleaning module, and the second opening being used for transferring of the wafer between the bearing unit and the wet cleaning module;
   the first blocking unit comprises a first baffle plate elastically connected to one side of the first opening by means of a hinge;

the second blocking unit comprises a second baffle plate elastically connected to one side of the second opening by means of a second hinge; and the control unit is connected to the bearing unit, the bearing unit moves towards the first opening, so as to drive the first baffle plate to be opened when the wafer is transferred between the bearing unit and the dry cleaning module, and the bearing unit moves towards the second opening, so as to drive the second baffle plate to be opened when the wafer is transferred between the bearing unit and the wet cleaning module.

4. The cleaning machine according to claim 1, wherein the conveying module comprises:

a first conveying unit that is connected to one of the wet cleaning module and the dry cleaning module and is configured to input the wafer into the wet cleaning module connected to the first conveying unit or the dry cleaning module connected to the first conveying unit; and a second conveying unit that is connected to the other one of the wet cleaning module and the dry cleaning module, and is configured to output the wafer from the wet cleaning module connected to the second conveying unit or the dry cleaning module connected to the second conveying unit.

5. The cleaning machine according to claim 1, wherein the transferring module comprises:

a first transferring unit, configured to transfer the wafer from the wet cleaning module to the dry cleaning module; and a second transferring unit, configured to transfer the wafer from the dry cleaning module to the wet cleaning module.

6. The cleaning machine according to claim 5, wherein the transferring module further comprises a third transferring unit that is connected to the conveying module and one of the wet cleaning module and the dry cleaning module, and is configured to transfer the wafer in the wet cleaning module or the dry cleaning module connected to the third transferring unit to the conveying module, so as to allow the conveying module to output the wafer from the wet cleaning module or the dry cleaning module.

7. The cleaning machine according to claim 1, wherein the wet cleaning module comprises:

a buffer chamber, configured to accommodate the wafer to be cleaned; and a plurality of cleaning chambers that are connected to the buffer chamber and are configured to perform the wet cleaning process on the wafer accommodated in the cleaning chambers.

8. The cleaning machine according to claim 1, wherein the dry cleaning module comprises:

a waiting chamber, configured to accommodate the wafer to be cleaned; and a plurality of reaction chambers that are connected to the waiting chamber and are configured to perform the dry cleaning process on the wafer accommodated in the reaction chambers.

9. The cleaning machine according to claim 8, wherein:

the dry cleaning module further comprises: a processing chamber, configured to anneal the wafer accommodated in the processing chamber; and the conveying module further comprises a cooling device, the cooling device being configured to cool the wafer before the conveying module outputs the wafer from the cleaning machine.

10. A cleaning method applied to the cleaning machine of claim 1, comprising:

acquiring a wafer to be cleaned and a cleaning process of the wafer;

determining, on a basis of the cleaning process of the wafer, whether the wafer to be cleaned needs to be subjected to the dry cleaning process and the wet cleaning process and a cleaning sequence of the dry cleaning process and the wet cleaning process; and controlling, on a basis of the cleaning sequence, a position of the wafer on the cleaning machine, so as to complete cleaning of the wafer;

when the cleaning sequence is to execute the wet cleaning process first and then the dry cleaning process, the controlling, on a basis of the cleaning sequence, a position of the wafer on the cleaning machine, so as to complete cleaning of the wafer comprises:

inputting the wafer into the wet cleaning module by using the conveying module, and executing the wet cleaning process on the wafer by using the wet cleaning module;

extracting the gas from the transferring module by using the processing module;

transferring the wafer from the wet cleaning module to the dry cleaning module by using the transferring module;

executing the dry cleaning process on the wafer by using the dry cleaning module; and outputting the wafer from the dry cleaning module by using the conveying module; and when the cleaning sequence is to execute the dry cleaning process first and then the wet cleaning process, the controlling, on a basis of the cleaning sequence, a position of the wafer on the cleaning machine, so as to complete cleaning of the wafer comprises:

inputting the wafer into the dry cleaning module by using the conveying module, and executing the dry cleaning process on the wafer by using the dry cleaning module;

extracting the gas from the transferring module by using the processing module;

transferring the wafer from the dry cleaning module to the wet cleaning module by using the transferring module;

executing the wet cleaning process on the wafer by using the wet cleaning module; and outputting the wafer from the wet cleaning module by using the conveying module.

11. A cleaning machine, comprising:

a wet cleaning module, configured to execute a wet cleaning process on a wafer;

a dry cleaning module, configured to execute a dry cleaning process on the wafer;

a conveying module, configured to input the wafer into the wet cleaning module or the dry cleaning module, or output the wafer from the wet cleaning module or the dry cleaning module;

a transferring module, configured to transfer the wafer from the wet cleaning module to the dry cleaning module, or transfer the wafer from the dry cleaning module to the wet cleaning module;

a processing module, configured to extract gas from the transferring module;

wherein the transferring module comprises:

a first transferring unit, configured to transfer the wafer from the wet cleaning module to the dry cleaning module; and a second transferring unit, configured to transfer the wafer from the dry cleaning module to the wet cleaning module;

wherein the transferring module further comprises a third transferring unit that is connected to the conveying module and one of the wet cleaning module and the dry cleaning module, and is configured to transfer the wafer in the wet cleaning module or the dry cleaning module connected to the third transferring unit to the conveying module, so as to allow the conveying module to output the wafer from the wet cleaning module or the dry cleaning module.

\* \* \* \* \*